United States Patent
Komatsuzaki (10) Patent No.: US 7,092,276 B2
(45) Date of Patent: Aug. 15, 2006

(54) SERIES FERAM CELL ARRAY

(75) Inventor: Katsuo Komatsuzaki, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/048,255

(22) Filed: Jan. 31, 2005

(65) Prior Publication Data

US 2005/0146916 A1    Jul. 7, 2005

Related U.S. Application Data

(62) Division of application No. 10/108,810, filed on Mar. 27, 2002, now Pat. No. 6,867,997.

(51) Int. Cl.
  *G11C 11/22* (2006.01)
  *G11C 11/42* (2006.01)
  *G11C 5/06* (2006.01)
  *G11C 7/00* (2006.01)
  *G11C 8/00* (2006.01)

(52) U.S. Cl. .............................. 365/145; 365/65; 365/72

(58) Field of Classification Search ................ 365/145, 365/65, 72, 189.05, 196, 207, 221, 222
See application file for complete search history.

(56) References Cited

U.S. PATENT DOCUMENTS

| | | | |
|---|---|---|---|
| 6,028,784 A | 2/2000 | Mori et al. | |
| 6,091,625 A * | 7/2000 | Braun et al. | 365/145 |
| 6,094,370 A | 7/2000 | Takashima | |
| 6,151,242 A | 11/2000 | Takashima | |
| 6,190,957 B1 * | 2/2001 | Mochizuki et al. | 438/240 |
| 6,301,145 B1 * | 10/2001 | Nishihara | 365/145 |
| 6,452,852 B1 | 9/2002 | Bohm et al. | |
| 6,459,118 B1 | 10/2002 | Kang | |
| 6,493,251 B1 | 12/2002 | Hoya et al. | |
| 6,876,567 B1 * | 4/2005 | Chow | 365/145 |
| 2002/0002779 A1 | 1/2002 | Takashima | |
| 2002/0027796 A1 | 3/2002 | Kato et al. | |
| 2002/0044477 A1 | 4/2002 | Takeuchi et al. | |
| 2002/0142488 A1 * | 10/2002 | Hong | 438/3 |
| 2002/0190304 A1 | 12/2002 | Kang | |
| 2002/0196656 A1 * | 12/2002 | Ogiwara et al. | 365/145 |
| 2002/0196658 A1 | 12/2002 | Ogiwara et al. | |
| 2003/0058701 A1 | 3/2003 | Takashima | |
| 2004/0047174 A1 | 3/2004 | Chen et al. | |

* cited by examiner

*Primary Examiner*—Amir Zarabian
*Assistant Examiner*—Ly Duy Pham
(74) *Attorney, Agent, or Firm*—Peter K. McLarty; W. James Brady, III; Frederick J. Telecky, Jr.

(57) ABSTRACT

Memory devices and memory cell groups therefor are disclosed, which comprise series connected ferroelectric (FE) memory cells accessible using a single bitline. The cells individually comprise a transistor and an FE capacitor where a single cell within the group or array is connected to a bitline for external access during read, write, and/or restore operations. Methods are also disclosed for reading target cells in a memory cell group.

1 Claim, 7 Drawing Sheets

SERIES FERAM CELL ARRAY

The application is a divisional of application Ser. No. 10/108,810, filed Mar. 27, 2002, now U.S. Pat. No. 6,867,997.

FIELD OF INVENTION

The present invention relates generally to semiconductor devices and more particularly to memory devices having cell groups with series connected ferroelectric memory cells and methods for operation thereof.

BACKGROUND OF THE INVENTION

In semiconductor memory devices, data is read from or written to the device using address signals and various other control signals. Such memory devices are used for storage of data and/or program code in personal computer systems, embedded processor-based systems, and the like. As with other types of memory, design efforts continue to strive for smaller and faster ferroelectric memories. For example, smaller memory devices can be manufactured typically on a more cost effective basis, to provide devices having higher storage densities. Toward that end, various scaling techniques have been employed to reduce the feature sizes and feature spacings for devices used in making ferroelectric memories, such as transistors and ferroelectric capacitors. However, architectural considerations may limit the amount of density improvement that can be achieved by process scaling techniques alone. Thus, while scaling may allow smaller feature sizes, such approaches typically employ existing memory device layout configurations and interconnection architectures, and so may provide only incremental reductions in device sizes.

Figure 1A:
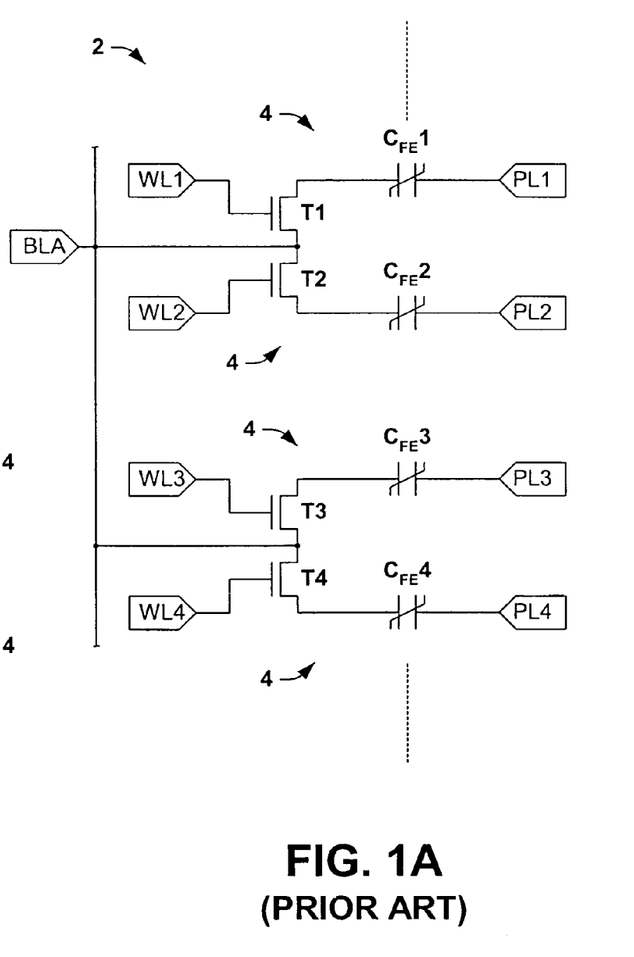
FIG. 1A is a schematic diagram illustrating a conventional 1T1C ferroelectric memory cell configuration.
Figure 1B:
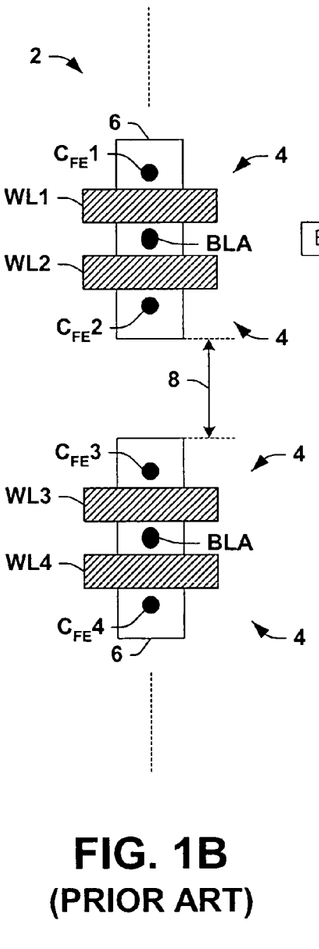
FIG. 1B is a top plan view illustrating a ferroelectric memory layout for the memory cell configuration of FIG. 1A.

Ferroelectric memories are commonly organized in single-transistor, single-capacitor (1T1C) or two-transistor, two-capacitor (2T2C) configurations, which are well known, wherein 1T1C architectures generally offer have smaller memory cell sizes than 2T2C approaches. However, conventional 1T1C and 2T2C approaches both suffer from architecture related limitations on the amount of density increase possible using scaling techniques alone. FIGS. 1A and 1B illustrate a common 1T1C ferroelectric memory cell configuration, wherein a memory device 2 is illustrated schematically in FIG. 1A comprising four such cells 4, and a top structural view thereof is provided in FIG. 1B. The 1T1C memory cells 4 individually comprise a single ferroelectric (FE) capacitor $C_{FE}$ adapted to store a binary data bit, which is connected in series with a MOS type transistor T providing selective access to the FE capacitor $C_{FE}$ during read, restore, and/or write operations.

The gates of the transistors T1–T4 are connected to corresponding wordlines WL1–WL4, respectively, for controlled selection of or access to the FE capacitors $C_{FE}1$–$C_{FE}4$, which in turn are connected between first source/drain terminals of the transistors T1–T4 and corresponding platelines PL1–PL4, respectively. Second source/drain terminals of transistors T1 and T2 are connected together and to a bitline BLA. The wordlines WL1–WL4 and platelines PL1–PL4 are controlled so as to selectively provide read, write, and restore accessibility of individual FE capacitors $C_{FE}1$–$C_{FE}4$ via the bitline BLA.

As illustrated in FIG. 1B, the cells 4 are organized in groups of two in order to facilitate connection of active regions 6 with a bitline BLA. However, the interconnection of memory cells 4 in this fashion results in a gap 8 between each adjacent pair of cells 4. The gap 8 and other such active area gaps in the device 2 occupy a significant portion of the total wafer area in the device 2, which cannot be eliminated by scaling down the sizes of devices $C_{FE}1$–4 or T1–4. From FIG. 1B, therefore, it is seen that the architectural interconnection and configuration of the components T and $C_{FE}$ in the conventional 1T1C organization limits the amount of density improvement that can be achieved by process scaling techniques alone.

A similar situation exists for conventional organizations of 2T2C ferroelectric memory cells (not shown), wherein layout gaps are required between active areas of groups of two memory cells, whereby scaling techniques alone cannot achieve optimal utilization of die area in fabricating FE memory devices. Thus, it will be appreciated that the manner in which the ferroelectric memory cells are connected with word lines, bit lines, and plate lines (e.g., the memory cell or array architecture) impacts the overall size of a ferroelectric memory device. Accordingly, there remains a need for improved ferroelectric memory cell configurations and interconnection architectures by which increased device densities and smaller device sizes may be achieved, alone or in combination with feature size scaling techniques.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One aspect of the invention relates to memory devices and memory cell groups or arrays therefor having series connected ferroelectric (FE) memory cells accessible using a single bitline. The cells may individually comprise a transistor and an FE capacitor for storing data, with a single cell within the group or array being connected to a bitline for external access during read, write, and/or restore operations. Any number of such cells may be serially connected in a cell group or array in accordance with the invention, whereby space savings may be achieved independently of, or in addition to those obtained through device size scaling techniques. In this regard, the invention may be employed to reduce the number of gaps (e.g., such as gap 8 in FIG. 1B) in a memory device when compared with typical FE memory cell configurations or architectures. Control circuitry may be provided by which the data in individual cells may be read, restored, and/or written in sequential fashion. In addition, the relative sizing of individual cells and the FE capacitors thereof may be adjusted within such memory cell groups, to facilitate the sequential access thereof.

Another aspect of the invention provides methods for reading data from a target memory cell in a series connected FE memory cell group, wherein a sense amp is selectively connected to a bitline associated with the cell group. Individual ferroelectric memory cells in the group are sequentially selected, beginning with the cell closest to the bitline. The methods further comprise sequentially sensing and buffering data from the selected cells, and transferring buffered data associated with the target cell to an I/O line. In one implementation, the method further comprises sequentially refreshing or writing memory cells in the group in reverse order.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the attached drawings, wherein like reference numerals are used to refer to like elements throughout. The invention relates to memory devices in which ferroelectric (FE) memory cells are grouped or organized in series with one another with a single cell in the array or group being connected to a single bitline. The following description and corresponding drawing figures illustrate one or more exemplary 1T1C implementations of the invention, wherein data may be read from or written/refreshed to individual target cells in a FE memory cell group through sequential selection of the cells. However, it is to be appreciated that the invention may be carried out in association with 2T2C FE memory cells, as well as with other cell configurations not illustrated herein. In addition, the sequential access of individual data cells illustrated hereinafter is but one example in accordance with the invention, and those of ordinary skill in the art will appreciate that other sequences fall within the scope of the appended claims, beyond those specifically illustrated and/or described herein.

Figure 2A:
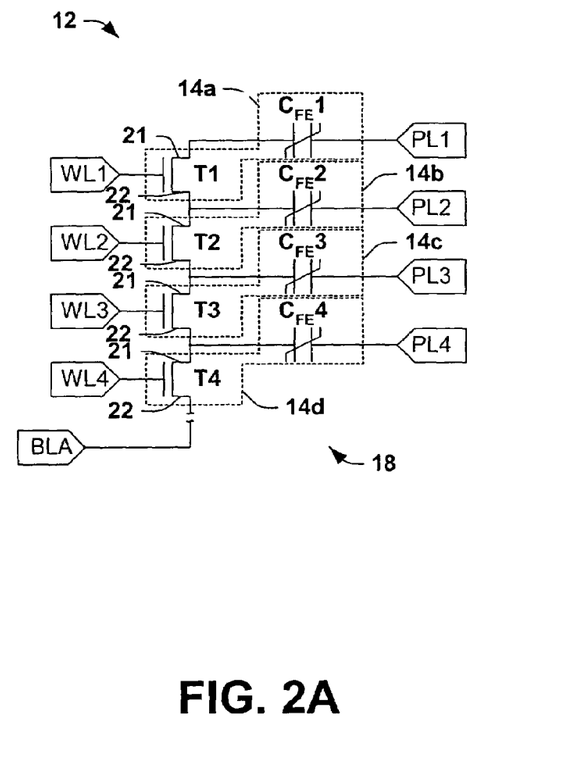
FIG. 2A is a schematic diagram illustrating an exemplary ferroelectric memory cell configuration having a plurality of series connected 1T1C ferroelectric memory cells in a group or array in accordance with an aspect of the present invention.
Figure 2B:
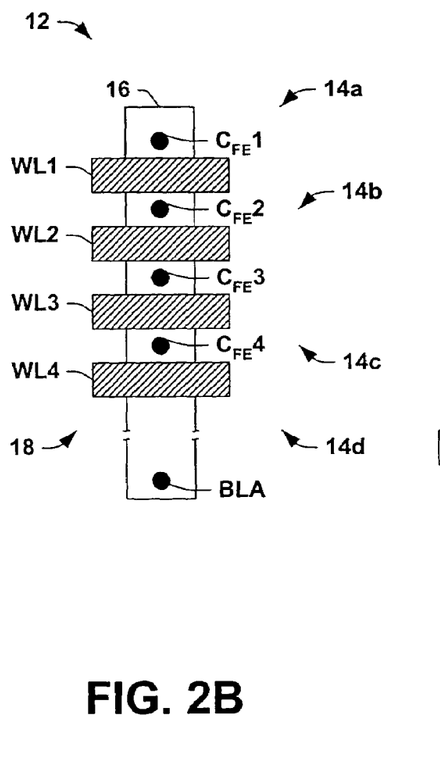
FIG. 2B is a top plan view illustrating a layout for the ferroelectric memory cell configuration of FIG. 2A.

FIGS. 2A and 2B illustrate several aspects of the present invention, in which a memory device 12 is illustrated comprising four 1T1C ferroelectric (FE) memory cells 14, wherein a schematic diagram is provided of the device 12 in FIG. 2A and a corresponding top structural view is provided in FIG. 2B. The FE memory cells 14 individually comprise a single ferroelectric (FE) capacitor $C_{FE}$ adapted to store a binary data bit associated with a corresponding data word in the memory device 12, wherein the memory cells 14 and groups thereof are organized in row and column fashion so as to create a memory array in which words comprising a number of data bits (e.g., 8, 16, 32, etc.) are accessible for reading and/or writing via control and address signals (not shown) applied externally to the device 12.

In the individual memory cells 14, an FE capacitor $C_{FE}$ is connected in series with a MOS type transistor T providing selective access to the FE capacitor $C_{FE}$ during read, restore, and/or write operations. Four cells 14a–14d are organized as a cell group or array 18 in the illustrated example, which are connected in series with one another with only the last such cell 14d in the group 18 being connected to a bitline BLA. Although illustrated as having four FE memory cells 14 in the group 18, any number of such memory cells 14 may be serially connected in an array or group in accordance with the invention.

As illustrated in FIG. 2B, the serial connection of the cells 14 provides for elimination of gaps between every pair of cells, as was found in conventional architectures. In this regard, a single active area or region 16 is provided for the entire FE memory cell group 18. This facilitates reduction in the wafer area required for a given number of memory cells 14, and allows increase in the memory cell density, either alone or in combination with device size scaling techniques. Thus, the invention may be employed to reduce memory device size without the advanced processes required to scale sizes of the components (e.g. FE capacitors $C_{FE}$ and transistors T) therein. Alternatively, the invention may be employed in conjunction with processes utilized to scale down the size of components to further reduce memory device size.

The individual transistor gates of transistors T1–T4 are connected to corresponding wordlines WL1–WL4 for controlled selection of the FE capacitors $C_{FE}1$–$C_{FE}4$ in the cells 14a–14d, respectively, wherein the wordlines WL1–WL4 may be selectively asserted using a control circuit for read, write, and/or restore operations, as illustrated and described below with respect to FIG. 3. The individual FE capacitors $C_{FE}1$–$C_{FE}4$ are connected between first source/drain terminals 21 of the transistors T1–T4 and corresponding platelines PL1–PL4, respectively. Second source/drain terminals 22 of the first transistor T1 and intermediate transistors T2 and T3 are connected to subsequent transistors in the group 18, and the second source/drain terminal 22 of the last transistor T4 is connected to the bitline BLA.

According to another aspect of the invention, the relative sizing of the ferroelectric capacitors $C_{FE}1$–$C_{FE}4$ may be adjusted to facilitate sequential access thereof during read, restore, and/or write operations in the device 2 by controlling sensing margin. For example, in the cell group 18 of FIG. 2A and 2B, the closest capacitor $C_{FE}4$ to the bitline BLA has the smallest relative size, wherein subsequent capacitors $C_{FE}3$, $C_{FE}2$, and $C_{FE}1$ have consecutively larger sizes. In this manner, the last FE capacitor $C_{FE}4$ is smaller than the adjacent intermediate FE capacitor $C_{FE}3$, which is smaller than the next intermediate FE capacitor $C_{FE}2$, which in turn is smaller than the first ferroelectric capacitor $C_{FE}1$. In one implementation, the relative sizes of the capacitors $C_{FE}$ in the group 18 are determined relative to that of the last capacitor $C_{FE}4$, where the size of $C_{FE}3$ is about 1.3 times that of $C_{FE}4$, the size of $C_{FE}2$ is about 1.6 times that of $C_{FE}4$, and the size of $C_{FE}1$ is about 1.9 times that of $C_{FE}4$. In another exemplary implementation, the size of $C_{FE}3$ is about 1.3 times that of $C_{FE}4$, the size of $C_{FE}2$ is about 1.7 times that of $C_{FE}4$, and the size of $C_{FE}1$ is about 2.2 times that of $C_{FE}4$.

Figure 4A:
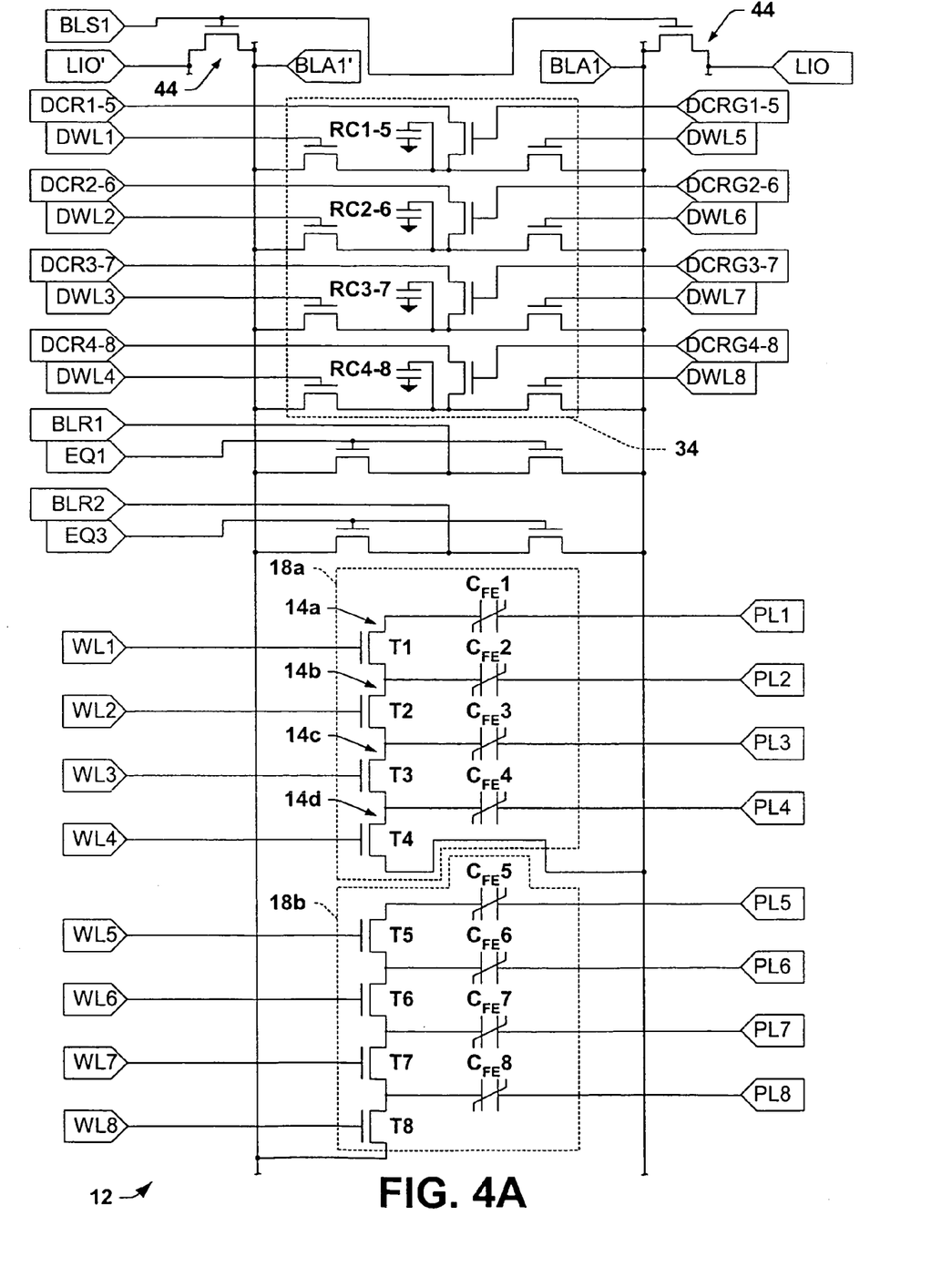
FIGS. 4A and 4B are schematic diagrams illustrating an exemplary detailed implementation of the memory device of FIG. 3, in which two groups of four serially connected ferroelectric memory cells are provided along with associated references capacitors, data buffers, and a sense amp.
Figure 4B:
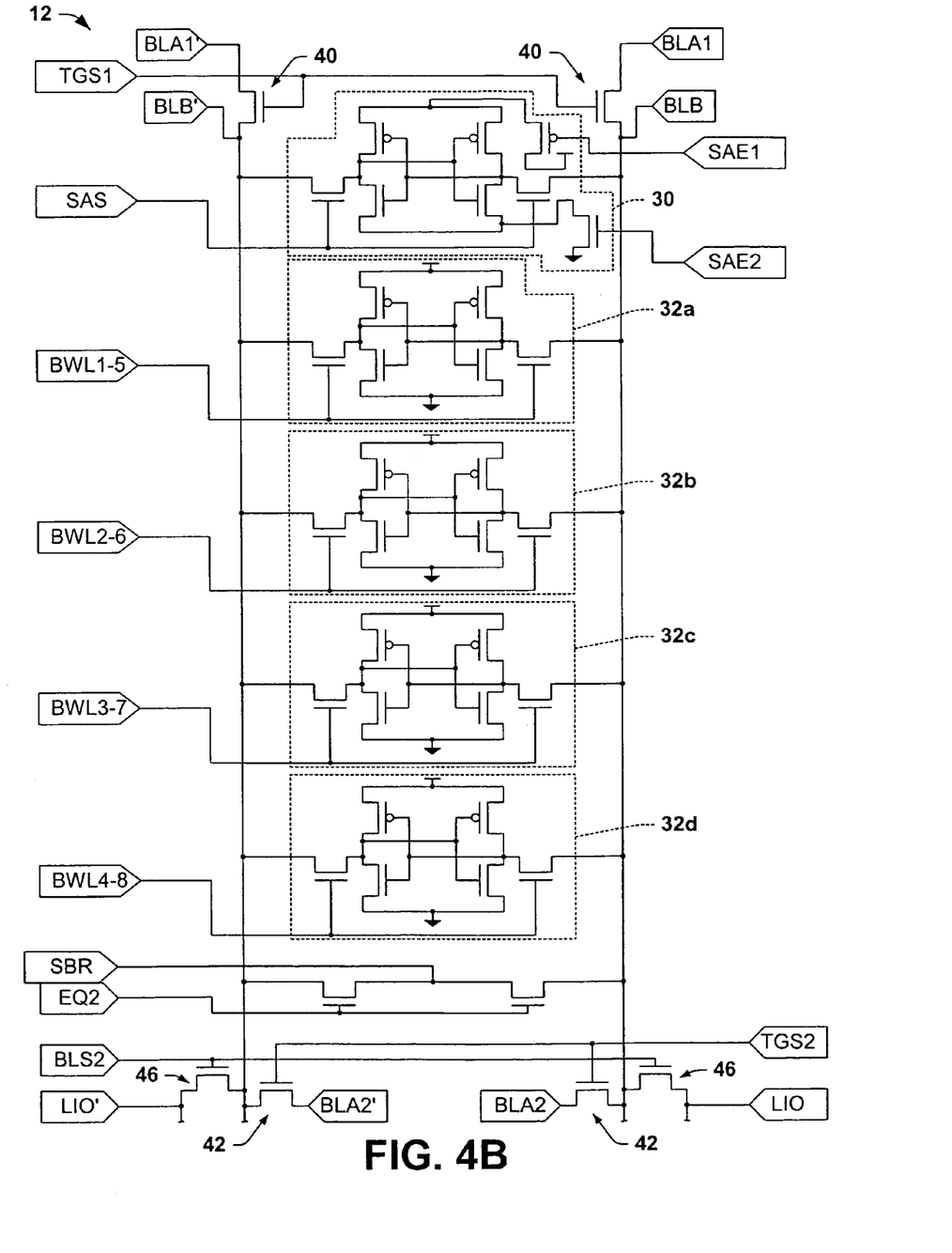
Figure 5:
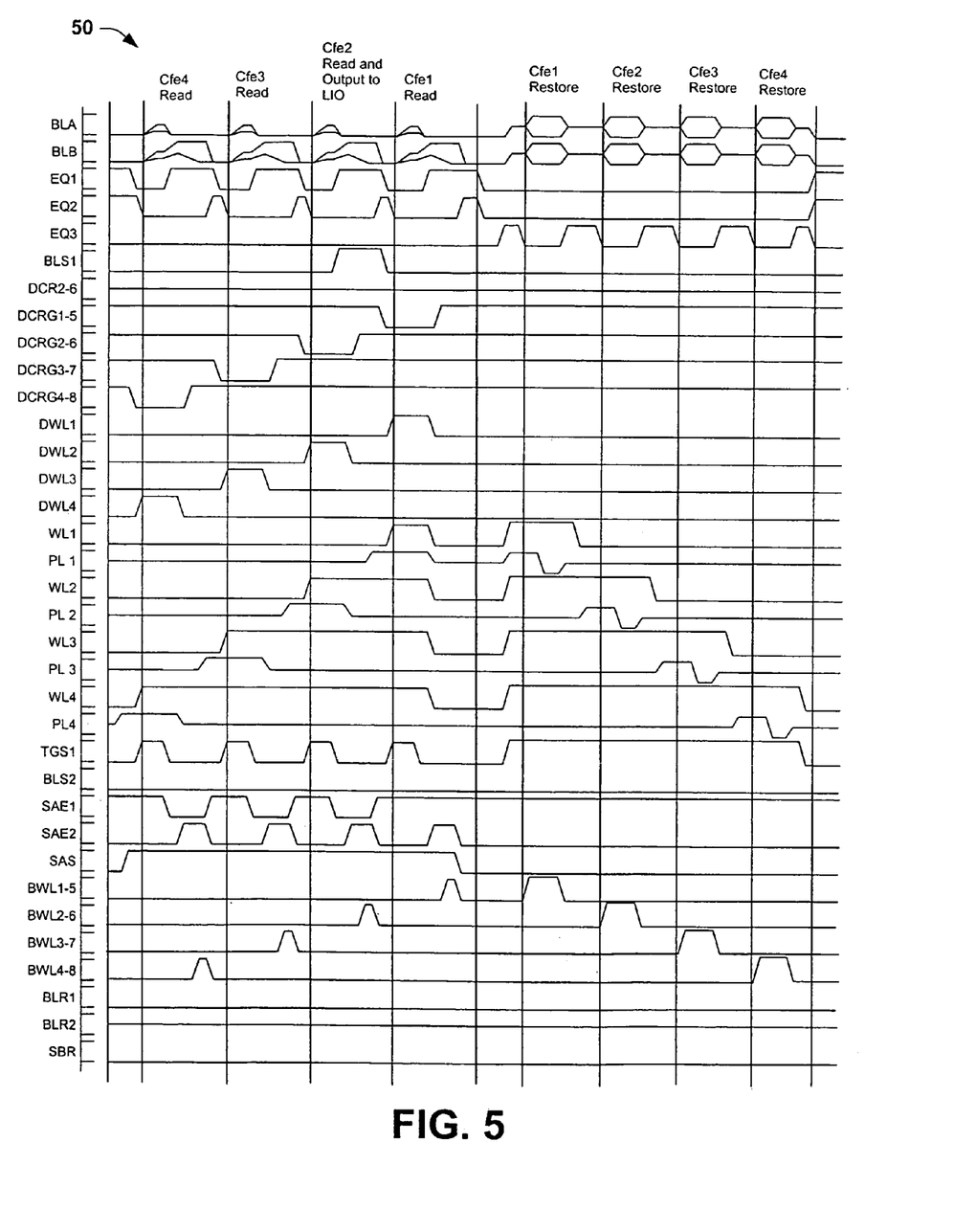
FIG. 5 is a timing diagram illustrating operation of the memory device of FIGS. 4A and 4B during reading of a target cell therein.

For example, the inventors have appreciated that in order to maintain consistent sensing margin for reading all data cells in the group 18, it is desirable to size the capacitors such that the ratio of the capacitance of the selected cell capacitor (e.g., $C_{FE}$TARGET) to the sum of the capacitances of the bitline (e.g., $C_{BL}$), the connected cell capacitance (e.g., $C_{FE}$CONNECTED), and the transistor capacitance (e.g., $C_{MOS}$) be similar or equal for accesses to each of the cells. In this regard, the implementation illustrated and described below with respect to FIGS. 4A, 4B, and 5 provides for sequential selection of cells within a group during read, restore, and write operations, wherein more than one memory cell 14 within the group 18 is selected simultaneously. In this regard, the invention may provide for equivalent sensing margins relatively independent of which particular cell data is being targeted for reading, through the relative sizing of the FE capacitors $C_{FE}$.

For example, if the capacitance of a non-targeted cell 14 in the group 18 is 40 ff, the capacitance of the word line selection MOS transistor T is 10 ff (fempto-farrads), the bitline capacitance is 150 ff, and the capacitance of the last FE capacitor $C_{FE}4$ is Y, the above ratio becomes Y/(150+40+10)ff for $C_{FE}4$. The ratio for $C_{FE}3$ is Y/(150+40+10+40*X+10), where X=1.3. Similarly, the ratio for $C_{FE}2$ is X/(150+40+10+40*1.3+10+40*X+10), where X=1.7, and for $C_{FE}1$, the ratio is X/(150+40+10+40*1.3+10+40*1.7+10+40*X+10), where X=2.2. In this example, therefore, the relative sizing of the FE capacitors $C_{FE}1$–$C_{FE}4$ (e.g., $C_{FE}4$:$C_{FE}3$:$C_{FE}2$:$C_{FE}1$) is 1:1.3:1.7:2.2

Where dummy cells are used to generate reference signals in a differential bitline type implementation, the relative capacitances of components in the dummy cells may likewise be scaled according to the capacitor sizes of $C_{FE}1$–$C_{FE}4$, for example, in order to facilitate control over sensing margin. In one example, illustrated below with respect to FIGS. 4A, 4B, and 5, the number of dummy cells is determined by the number of FE memory cells 14 per group 18 (e.g., four in the illustrated examples). In this case, the dummy cell capacitance may be set equal or close to the total capacitance of memory cells 14 and WL transistor connected to the bitline BLA during sensing. Many different dummy cell schemes are possible, for example, wherein the number of accessed dummy cells is equal to the number of activated word lines. In such a case (e.g., FIGS. 4A, 4B, and 5 below), the relative sizes of the dummy cell capacitances may be sized in similar fashion to the relative sizing of the FE memory cell capacitances $C_{FE}$. In another example, a single dummy cell may be used. It will be appreciated that the invention is not limited to any particular reference voltage generation structure, and that any reference system may be used for sensing, reading, restoring, and/or writing the cells according to the invention.

Figure 3:
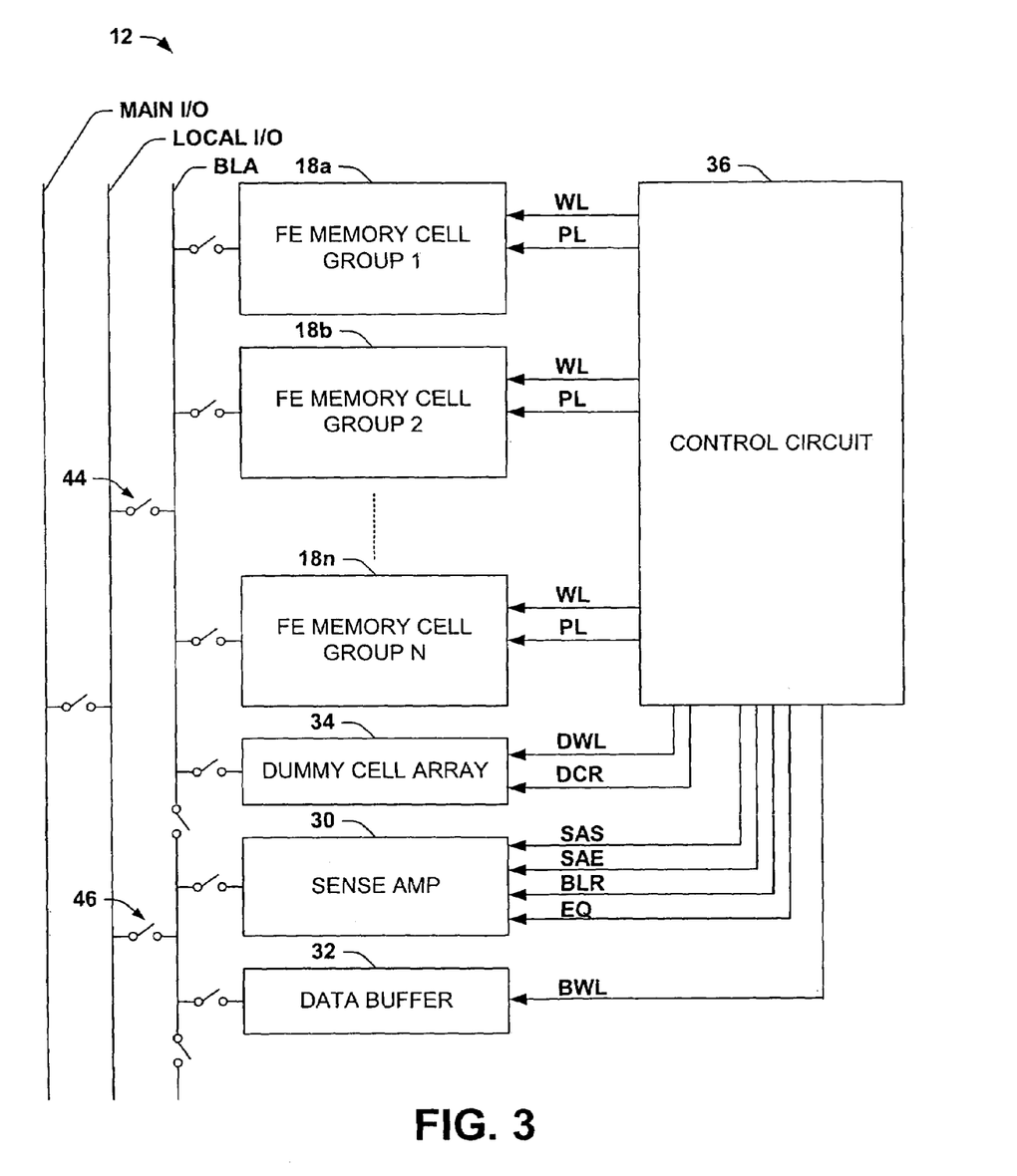
FIG. 3 is a schematic diagram illustrating a portion of a memory device in which one or more aspects of the invention may be carried out, including an integer number of memory cell groups or arrays of serially connected ferroelectric memory cells and a control circuit for read, write, and/or restore operations according to the invention.

Referring also to FIG. 3, a plurality of such FE memory cell groups or arrays 18a–18n may be organized to form a portion or sector of an overall memory architecture of the device 12, wherein the bitline BLA is selectively connectable to the cell groups 18, a shared sense amp 30, a data buffer 32, a dummy cell array 34, and local and main I/O lines under control of a control circuit 36. The wordlines WL1–WL4 and platelines PL1–PL4 may be selectively activated by the control circuit 36 in order to provide read, write, and restore accessibility of individual FE memory cells in the cell groups 18 via the bitline BLA. The control circuit 36 also provides dummy word lines (DWL) and dummy cell references (DCR) to the dummy cell array 34, sense amp select and enable signals (SAS, SAE), a bitline reference (BLR) and equalization signals (EQ) to the sense amp 30, as well as buffer word lines (BWL) to the data buffer 32.

The bitline BLA in FIG. 3, moreover, may comprise two complimentary bitlines establishing a differential signal corresponding to data being read, written, or refreshed in the cell groups 18, as illustrated below in FIGS. 4A and 4B. Thus, for example, in a read operation, one such bitline BLA may be connected to one of the cells 14a–14d with a reference being established on a complimentary bitline BLA' via connection to the dummy cell array 34 through selective activation of the appropriate control and reference signals from the control circuit 36. The sense amp 30, data buffer 32, dummy cell array 34, and the FE memory cell groups 18 in the device 12 may thus be differential in layout, having appropriate interconnection transistors for selective connection thereof with one or both of such complimentary bitlines under control of the control circuit 36.

Referring now to FIGS. 4A and 4B, details of a portion of the exemplary memory device 12 are illustrated including two serially connected FE memory cell groups 18a and 18b, wherein the group 18a comprises four 1T1C FE memory cells 14a–14d similar to the group 18 of FIGS. 2A and 2B. The cells 14a–14d of the group 18a are accessed through connection with a bitline BLA1 according to wordlines WL1–WL4 and platelines PL1–PL4 from the control circuit 36 (FIG. 3) via transistors T1–T4 therein, and a second cell group 18b is accessed using wordlines WL5–WL8 and platelines PL5–PL8 therefrom for connection to a complimentary bitline BLA1'. The transistor T4 of the last cell 14d in the group 18a is connected to a bitline BLA1, whereas the last transistor of the second group 18b is connected to a complimentary bitline BLA1' in the exemplary device 12.

During a read, restore, or write operation targeting one of the cells 14a–14d in the cell group 18a, one or more of the capacitors $C_{FE}1$–$C_{FE}4$ therein are thus connected to BLA1, while a corresponding one or more reference elements, such as capacitors RC1-5, RC2-6, RC3-7, and/or RC4-8 are connected to the complimentary bitline BLA1' to provide a reference voltage thereto, such as about half the sum of the "0" data signal voltage plus the "1" data signal voltage (e.g., [$V_{"0"}+V_{"1"}$]/2). Similarly, where a cell in the group 18b is accessed, one or more cells thereof are connected to BLA1', while corresponding dummy reference cells in the array 34 are connected to BLA1. In either case, a differential signal is created on the complimentary bitlines BLA1 and BLA1', which is then provided to the differential sense amp 30 (FIG. 4B) via activation of switch transistors 40 according to a control signal TGS1 from the control circuit 36. These switch transistors 40, together with similar transistors 42 allow the sense amp 36, as well as data buffers 32a–32d to be shared among a large number of such cell groups 18 according to signals TGS1 and TGS2.

Referring also to FIG. 5, the control circuit 36 employs control signals WL, PL, DWL, EQ, SAS, SAE, and BWL and provides references DCR, BLR, and SBR during various read, write, and restore operations to provide access to and data transfer between the local bitlines BLA1, BLA1' and the local and main I/O lines in the device 12. For example, during read operations targeting a word with a data bit stored in the memory cell group 18a, the control circuit 36 provides control signal TGS1 to selectively connect the bitlines BLA1 and BLA1' to the sense amp 30 via the lines BLB and BLB', respectively, and also provides appropriate wordline and plateline signals WL1–WL4 and PL1–PL4, respectively, to select the target ferroelectric memory cell 14.

FIG. 5 illustrates a timing diagram 50 showing operation of the device 12 during a read targeting the FE memory cell 14b of FIG. 4A to read and restore data in FE capacitor $C_{FE}2$, wherein the control circuit 36 selectively connects the target cell 14b, the last cell 14d, and the intervening intermediate cell 14c to the bitline BLA1 in sequential fashion, by actuating wordline/plateline signals WL4/PL4, WL3/PL3, WL2/PL2 in sequence as shown in the diagram 50 of FIG. 5. During such actuations, the sensed voltage from the selected cells 14 is transferred from the sense amp 30 to one of the buffers 32. At the point where the target cell 14b has been selected and sensed (e.g., along with the cells 14c and 14d), the sensed data is transferred from the sense amp 30 to the buffer 32b, as well as to local I/O lines LIO and LIO' via actuation of local I/O access transistors 44 using signal BLS1 from the control circuit 36. Switches 46 of FIGS. 4B and 3 may be activated to read or write data from or to the data buffer 32 using signal BLS2, which may be employed to minimize write cycle time. For instance, if target data are stored in one memory group, read access to the data buffer 32 through switches 46 after completion of data transfer from a memory cell 14 to a data buffer 32 may provide shorter read cycle time, although some latency is required.

It is noted that in the illustrated implementation of the device 12, the control circuit 36 selects all the FE memory cells 14a–14d during a read of any of the cells 14 in the cell group 18a in sequential fashion beginning with the last ferroelectric memory cell 14d. Other implementations are possible within the scope of the invention, for example, wherein the sequence proceeds only until the desired or target cell data has been sensed (e.g., together with the cells between the target cell and the bitline BLA1), at which time the sensed (target cell) data is transferred to the I/O lines for use elsewhere in the device 12. However, due to the serial connection of the individual memory cells 14a–14d in the cell group 18a, the cells between the target cell and the bitline BLA1, as well as the target cell, are selected at the same time, as illustrated in FIG. 5.

For example, in the illustrated example where data from cell 14b is read, the wordlines WL4, WL3, and WL2 are all active while the second cell 14b data is being sensed, so as to provide connection of the FE capacitor $C_{FE}2$ through the intervening second, third, and fourth transistors T2, T3, and T4 to the bitline BLA1 (e.g., and hence to the sense amp 30). It is noted at this point, that in the illustrated implementation, individual buffer stages 32a–32d are used to buffer cell data associated with the cells 14a–14d, respectively. Thus, when cell 14d is selected, data therefrom is sensed (e.g., using the sense amp 30), and buffered by storage thereof into the last buffer 32d. Next, as cells 14d and 14c are selected, sensed data therefrom is buffered into the third buffer 32c, and so on in sequential fashion, until the data sensed when all cells 14a–14d are selected is buffered into the first buffer 32a.

At powerup of the device 12, all nodes are 0v except EQ1, EQ2, SAE2, PL, BLR, and DCR, where EQ1, EQ2 and SAE2 are at VDD, PL is half VDD, and the levels of BLR and DCR vary depending on the particular sensing operation. As illustrated in the diagram 50 of FIG. 5, BLR1 and SBR are 0v to start the sensing using the PMOS transistors of the sense amp 30, and alternatively if the sensing begins with the NMOS sense amp transistors, the BLR1 and SBR signals are at VDD. The voltage difference between the plateline and BLR1 or SBR is less than the FE capacitor coercive voltage to minimize the cell capacitance change between "0" and "1" states for non targeted FE capacitors in the cell group 18a, wherein during access to the second cell 14b, the cells 14b, 14c, and 14d are selected, but cells 14c and 14d are non targeted. In this case, BLR2 is half VDD to prevent data flip during a write operation if bit line capacitance is high and has imbalances. In addition, the dummy cell reference level DCRG is VDD at this point.

To initially read the data in the FE capacitor $C_{FE}4$, PL4 and SAS are set to VDD by the control circuit 36, after which the EQ2 and DCRG signals are brought to 0v. By activating SAS, the inside node of sense amp 30 is equalized, and WL4, DWL4 and TGS1 are then brought to VDD to connect $C_{FE}4$ to the sense amp 30. Once the signal charge is distributed to the sense amp 30, BLA1 and BLA1' will have different voltage levels based on signal charge from $C_{FE}4$ and the selected dummy reference capacitor RC4-8. In this manner, a differential voltage is generated on the complimentary bitlines BLA1 and BLA1'. The sense operation includes grounding TGS1 to 0v and taking SAE1 to 0v to start sensing by the PMOS transistors in the sense amp 30. EQ1 is taken to VDD to pre charge the bit line of the memory cell side of transistors 40, and SAE2 is taken to VDD to activate the sense amp NMOS transistors to latch the data from cell 14d, with PL4 being set to a plateline pre-charge level such as half VDD.

The latched data is then transferred to the corresponding buffer 32d by taking BWL4–8 to VDD. Thereafter BWL4–8 is returned to 0v to isolate the buffer 32d from the shared sense amp 30 and the bitlines BLA1 and BLA1', and SAE1 is set to VDD and SAE2 to 0v. Finally, EQ2 is set to VDD to equalize the bit line of the sense amp side of the transistors 40. Following this sensing and buffering of the data from the last cell 14d, a similar procedure is followed with respect to the next cell 14c to provide sequential sensing and buffering in accordance with the invention. With the last wordline WL4 maintained at VDD, PL3 is set to VDD and EQ2 is set to 0v. WL3, DWL3, and TGS1 are set to VDD to connect $C_{FE}3$ to the sense amp 30, together with $C_{FE}4$ via the bitline BLA1. $C_{FE}3$ is biased by the bitline BLA1 and PL3 is more than the coercive voltage of the FE capacitor $C_{FE}3$. However, it is noted that the bias of $C_{FE}4$ is less than the coercive voltage since PL4 is around half VDD while PL3 is at VDD. As a result, the signal charge in sensing the intermediate cell 14c is derived mainly from $C_{FE}3$.

Thereafter the sensed signal is buffered to the third buffer 32c in similar fashion as that described above with respect to buffering data into the buffer 32d. The sequence continues on to sense the data in the second (e.g., target) cell 14b, wherein the selection of previous cells 14d and 14c is maintained by maintaining the signals WL4 and WL3 at VDD. The sense amp 30 is provided with the voltage resulting from the simultaneous selection of cells 14d, 14c, and 14b as illustrated in FIG. 5, and the sensed data is buffered to the corresponding second buffer 32b. At this point, since the second cell 14b is the desired target cell to be read, the data is provided (e.g., as a differential signal) to the local I/O lines LIO and LIO' by actuation of the bitline select signal BLS1. Thereafter, the exemplary read operation continues in similar fashion to sense and buffer data from the first cell 14a in the cell group 18a.

Because the read operation of the FE cells 14 is destructive, the data is thereafter restored to the cells 14a–14d in the group 18a in reverse order. Thus, the data is restored from the first buffer 32a to the cell 14a (e.g., with all cells 14a–14d selected via activation of wordlines WL1–WL4 and platelines PL1–PL4, respectively, as shown in FIG. 5).

This is followed by restoration of data from the second buffer 32b to the second cell 14b (e.g., with the second, third, and last cells 14b, 14c, and 14d selected). In this regard, following each restore operation, the cell most recently restored is deselected before proceeding (e.g., be deactivation of the corresponding wordline WL in the diagram 50 of FIG. 5).

To begin restore operation, EQ3 is taken to VDD to bring the bitline BLA1 to half VDD. BLR3 may be driven based on restore operation margin, such as a data buffer data flip margin. In this example it is assumed that only the data buffers 32 are providing data to the memory cells 14 in the group 18a. However, if a large capacitance imbalance or voltage imbalance exists between BLA1 and BLA1', data flip may occur. If no margin is expected, the sense amp 30 may be used to assist the data restoration, in which case another sensing sequence may be employed prior to restoring the data to the memory cells 14.

Initially, data is restored from the first buffer 32a to the first cell capacitor $C_{FE}1$. WL1–WL4, TGS1 and PL1 are set to VDD, after which EQ3 is set to 0v, with BWL1–BWL5 being set to VDD. This connects $C_{FE}1$ to the data buffer 32a, and transfers data from the buffer 32a to $C_{FE}1$. Thereafter, PL1 is set to 0v to complete the data restore, after which PL1 is set to half VDD. WL1 and BWL1–5 are then set to 0v to deselect the first cell 14a and the first buffer 32a. Similar steps are then performed to transfer or restore data from the second buffer 32b to the cell 14b, with the first cell 14a deselected and the remaining cells 14b–14d selected, and the process repeats sequentially to restore data to the third and fourth FE memory cells 14c and 14d. In this regard, it is noted that similar operations are performed to sequentially write data from the local I/O lines LIO and LIO' to a target cell 14 in the group 18a, with the buffers 32 not being selected, details of which will be apparent to those skilled in the art and which are omitted here for the sake of brevity. It is noted at this point, that the restore operations (e.g., as well as write operations) are performed in sequential fashion in reverse order from that used during read operations, as illustrated in diagram 50 of FIG. 5.

Figure 6:
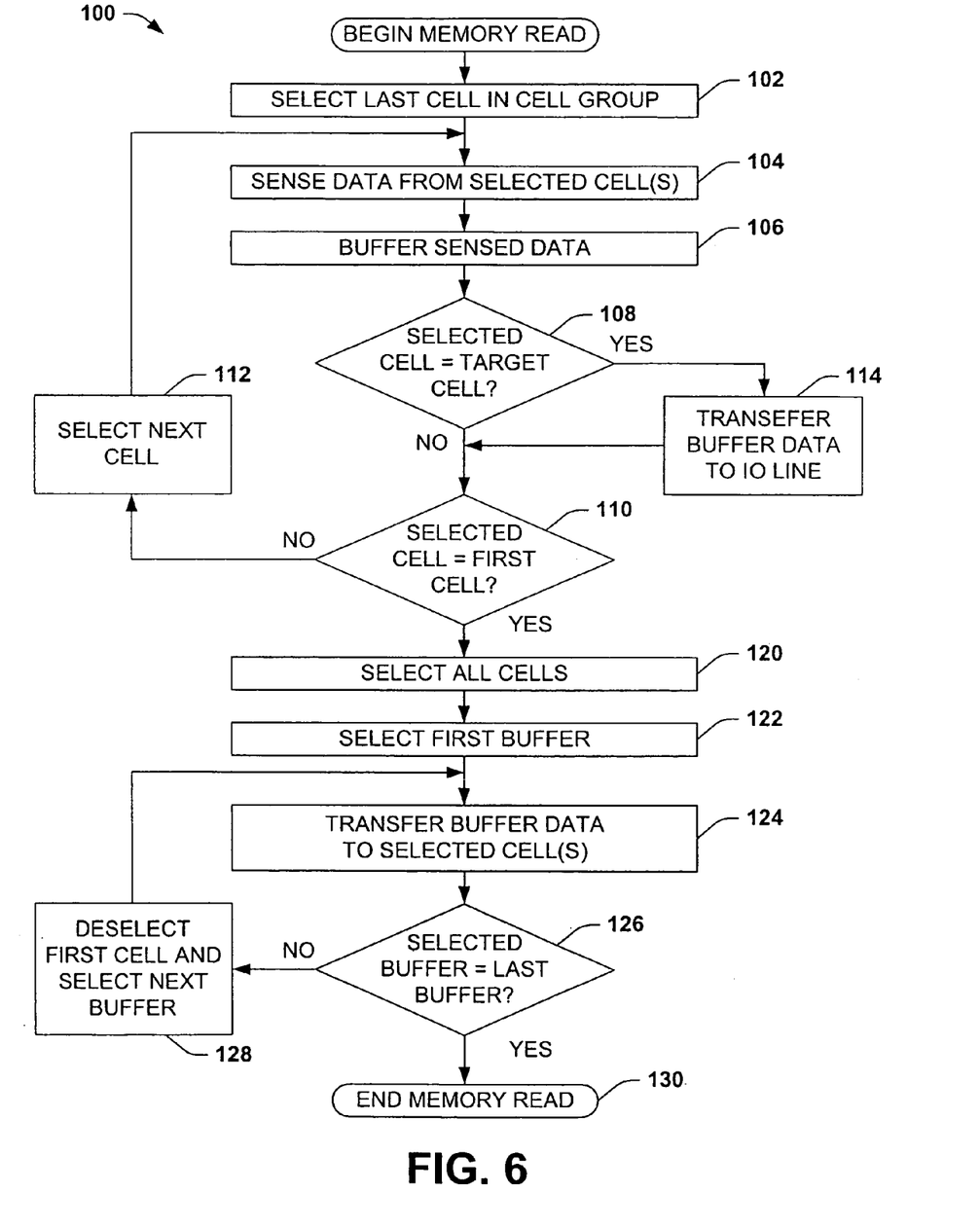
FIG. 6 is a flow diagram illustrating an exemplary method of reading a memory device in accordance with another aspect of the invention.

Referring now to FIG. 6, another aspect of the invention involves methods for reading data from a memory cell in a memory device having serially connected FE memory cells organized into memory cell groups with a single cell being connected to a bitline. The methods according to the invention involve selectively connecting a sense amp to a bitline to read a data bit from a target cell in the group, sequentially selecting individual ferroelectric memory cells in the group beginning with the last ferroelectric memory cell, sequentially sensing and buffering data from the selected cells, and transferring buffered data associated with the target cell to an I/O line. The methods may further comprises writing or restoring data from one or more buffers (e.g., or local I/O lines) sequentially in reverse order, deselecting cells once they have been restored.

One exemplary method 100 is illustrated and described hereinafter in accordance with the invention. Although the method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of memory devices illustrated and described herein as well as in association with other structures not illustrated.

Beginning at 102, a last cell (e.g., such as FE memory cell 14d in the cell group 18a described above) is selected at 102, which is closest to the bitline in the cell group. Data is sensed from the selected cell at 104 and the sensed data is buffered at 106 (e.g., using the sense amp 30 and buffer 32 illustrated and described above). A determination is made at 108 as to whether the selected cell is the target cell. If not, (NO at 108), a determination is made at 110 as to whether the selected cell is the first cell in the group (e.g., the farthest cell from the bitline). If not, (NO at 110), the next cell is selected at 112, and the method returns to 104 where data from the selected cells is sensed and then buffered at 106. The process continues in this fashion, selecting, sensing, and buffering data from further cells in the series until the target cell data has been sensed (YES at 108). At this point, the sensed target cell data is transferred to an I/O line at 114, and the method 100 returns to 110. This entire read process continues until all the cells in the group have been sensed and buffered (YES at 110).

Once all the cells in the group have been sensed and the corresponding data buffered, the method 100 proceeds to 120 to begin restoration of the cell data from the buffer back to the FE memory cells. At 120, all cells in the group are selected and a first buffer is selected at 122. The data from the selected buffer is transferred to all the selected cells at 124 and a determination is made at 126 as to whether the selected buffer corresponds to the last memory cell in the group being restored. If not (NO at 126), the first cell is deselected and the next buffer is selected at 128. The method 100 then returns to 124 where data from this (second) buffer is transferred to the FE memory cells still selected (the second through the last cells). The method 100 continues in this fashion to sequentially deselect further cells in the series and select other buffers until the selected buffer corresponds to the last data cell (YES at 126), whereafter the method 100 ends at 130. Thus, the method 100 involves sequentially reading data from the grouped cells beginning with the last cell, and then restoring (e.g., or writing) data to the cells sequentially in reverse order, beginning with the first cell.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. In a memory device, a memory cell group for storing a plurality of data bits, comprising:

a plurality of ferroelectric memory cells connected in series with one another and accessible using a single bitline, the ferroelectric memory cells individually comprising a transistor and a ferroelectric capacitor for storing a data bit associated with a corresponding data word, wherein a single ferroelectric memory cell of the plurality of ferroelectric memory cells is connected to the bitline, and wherein the plurality of ferroelectric memory cells comprises a first ferroelectric memory cell, a last ferroelectric memory cell, and at least one intermediate ferroelectric memory cell, the first, last, and intermediate ferroelectric memory cells being connected in series with one another with the at least one intermediate ferroelectric memory cell being connected between the first and last ferroelectric memory cells, and wherein the last ferroelectric memory cell is connected to the bitline, and wherein the first ferroelectric memory cell comprises a first ferroelectric capacitor connected between a first source/drain terminal of a corresponding first transistor and a first plateline corresponding to a first data word, the first transistor comprising a second source/drain terminal connected to an intermediate ferroelectric memory cell and a gate terminal connected to a first wordline corresponding to a first data word; wherein each intermediate ferroelectric memory cell comprises an intermediate ferroelectric capacitor connected between a first source/drain terminal of a corresponding intermediate transistor and an intermediate plateline corresponding to an intermediate data word, the intermediate transistor comprising a second source/drain terminal connected to a subsequent ferroelectric memory cell and a gate terminal connected to an intermediate wordline corresponding to an intermediate data word; and wherein the last ferroelectric memory cell comprises a last ferroelectric capacitor connected between a first source/drain terminal of a corresponding last transistor and a last plateline corresponding to a last data word, the last transistor comprising a second source/drain terminal connected to a subsequent ferroelectric memory cell and a gate terminal connected to the bitline.

* * * * *